(12) United States Patent
Pelissier

(10) Patent No.: US 6,650,132 B2
(45) Date of Patent: Nov. 18, 2003

(54) METHOD AND APPARATUS FOR TEMPERATURE CONTROL OF A DEVICE DURING TESTING

(75) Inventor: Jean Luc Pelissier, Palo Alto, CA (US)

(73) Assignee: Delta Design, Inc., Poway, CA (US)

( * ) Notice: Subject to any disclaimer, the term of this patent is extended or adjusted under 35 U.S.C. 154(b) by 0 days.

(21) Appl. No.: 10/197,890

(22) Filed: Jul. 19, 2002

(65) Prior Publication Data

US 2002/0186031 A1 Dec. 12, 2002

Related U.S. Application Data

(62) Division of application No. 08/734,212, filed on Oct. 21, 1996, now Pat. No. 6,476,627.
(60) Provisional application No. 60/092,715, filed on Jul. 14, 1998.

(51) Int. Cl.[7] ............................. G01R 31/02; H05B 1/00
(52) U.S. Cl. ........................ 324/760; 219/209; 702/130
(58) Field of Search ............................ 324/760, 763, 324/765, 158.1; 702/130; 713/300, 310, 320, 321, 322, 323, 324, 330, 340; 219/209

(56) References Cited

U.S. PATENT DOCUMENTS

| 3,710,251 | A | 1/1973 | Hagge et al. |
| 4,324,285 | A | 4/1982 | Henderson |
| 4,330,809 | A | 5/1982 | Stanley |
| 4,635,256 | A | 1/1987 | Herlein |
| 4,635,259 | A | 1/1987 | Schinabeck et al. |
| 4,637,020 | A | 1/1987 | Schinabeck |
| 4,646,299 | A | 2/1987 | Schinabeck et al. |
| 4,651,038 | A | 3/1987 | Cline et al. |
| 4,675,562 | A | 6/1987 | Herlein et al. |
| 4,686,627 | A | 8/1987 | Donovan et al. |
| 4,713,612 | A | 12/1987 | Takamine |

(List continued on next page.)

FOREIGN PATENT DOCUMENTS

| DE | 3536098 | 4/1987 |
| JP | 09264647 | 10/1997 |

*Primary Examiner*—Ernest Karlsen
(74) *Attorney, Agent, or Firm*—Foley & Lardner

(57) ABSTRACT

A method for controlling the temperature of a DUT during a testing operation, includes a) measuring a parameter related to power consumption by the DUT during testing, such as current consumption; and b) using the parameter related to power consumption to operate a temperature control device to compensate for temperature change due to changes in power consumption by the DUT during testing. The control can be closed loop or open loop with control signals incorporated into a test program. Apparatus for controlling the temperature of a DUT during testing, includes a) a device for measuring a parameter related to power consumption by the DUT during testing; b) a temperature control device which operates to control the temperature of the DUT during test; and c) a device for controlling operation of the temperature control device according to the measured parameter related to power consumption.

26 Claims, 3 Drawing Sheets

U.S. PATENT DOCUMENTS

| | | |
|---|---|---|
| 4,734,872 A | 3/1988 | Eager et al. |
| 4,777,434 A | 10/1988 | Miller et al. |
| 4,784,213 A | 11/1988 | Eager et al. |
| 4,789,835 A | 12/1988 | Herlein |
| 4,820,944 A | 4/1989 | Herlein et al. |
| 4,849,702 A | 7/1989 | West et al. |
| 4,881,591 A | 11/1989 | Rignall |
| 5,006,796 A | 4/1991 | Burton et al. |
| 5,084,671 A | 1/1992 | Miyata et al. |
| 5,099,908 A | 3/1992 | Taraci et al. |
| 5,164,661 A | 11/1992 | Jones |
| 5,198,752 A | 3/1993 | Miyata et al. |
| 5,205,132 A | 4/1993 | Fu |
| 5,233,161 A | 8/1993 | Farwell et al. |
| 5,287,292 A | 2/1994 | Kenny et al. |
| 5,297,621 A | 3/1994 | Taraci et al. |
| 5,309,090 A | 5/1994 | Lipp |
| 5,315,240 A | 5/1994 | Jones |
| 5,324,916 A | 6/1994 | Goto et al. |
| 5,369,245 A | 11/1994 | Pickering |
| 5,381,087 A | 1/1995 | Hirano |
| 5,420,521 A | 5/1995 | Jones |
| 5,452,401 A * | 9/1995 | Lin ............................ 713/322 |
| 5,457,400 A | 10/1995 | Ahmad et al. |
| 5,485,179 A | 1/1996 | Otsuka et al. |
| 5,552,744 A | 9/1996 | Burlison et al. |
| 5,557,551 A | 9/1996 | Craft |
| 5,569,950 A | 10/1996 | Lewis et al. |
| 5,582,235 A | 12/1996 | Hamilton et al. |
| 5,802,856 A | 9/1998 | Schaper et al. |
| 5,928,365 A * | 7/1999 | Yoshida ...................... 713/324 |
| 6,489,793 B2 | 12/2002 | Jones et al. |

\* cited by examiner

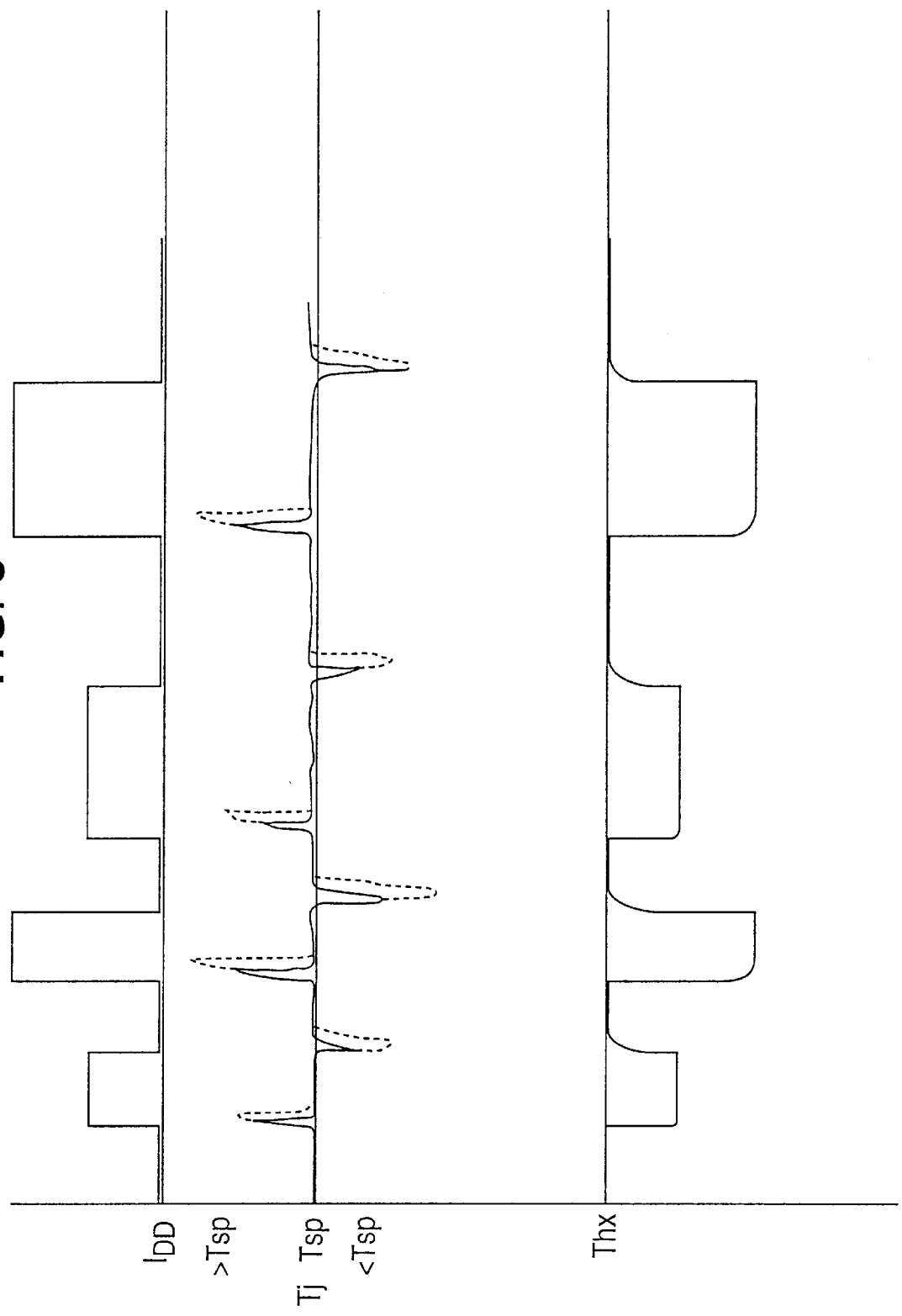

METHOD AND APPARATUS FOR TEMPERATURE CONTROL OF A DEVICE DURING TESTING

This is a Divisional Application of application Ser. No. 08/734,212, filed Oct. 21, 1999 now U.S. Pat. No. 6,476,627.

FIELD OF THE INVENTION

The present invention relates to methods and apparatus which can be used to maintain the temperature of a device such as a semiconductor integrated circuit device during a testing operation. In particular, the invention relates to a technique in which the device can be cooled and/or heated during testing in order to control the temperature of the device despite the varying levels of heat generated by the operation of the device.

BACKGROUND OF THE INVENTION

Control of DUT ("device under test") temperature in testing operations has been practiced for some time. During burn-in, for example, the DUT is placed in an environment with an elevated temperature, typically an oven, and signals applied for a prolonged period in order to promote failure of the device which would otherwise occur only after extensive use. The burn-in process uses the elevated temperature to accelerate what would otherwise be a very long-term process within the DUT. In an oven-type burn-in operation, a large number of devices are loaded on burn-in boards which are placed in the oven and tested together.

In other tests, it has been proposed to control the temperature of the DUT so as to simulate possible ambient temperatures during normal use. In such cases, a bulk temperature control is not appropriate because the temperature of each individual DUT can vary significantly over short periods of time. Also, it is not possible to change the temperature of the DUT reliably or quickly during the test process. A number of proposals have been made for more accurate control of DUT temperature variation during testing is to affect the accessed maximum speed of the device in normal use, known as "speed binning." Inaccuracy in this assessment can lead to failure of a device in normal use.

U.S. Pat. No. 5,297,621 discloses a liquid bath in which devices are immersed during testing. The liquid in the bath is inert and comprises a mixture of two liquids having boiling points above and below the desired temperature. By varying the mixture of the two liquids, the liquid in the bath is arranged to have a boiling point which is at the desired operating temperature of the DUT ("set point temperature"). Heat generated by the DUT is dissipated by convection within the bath and by nucleate boiling of the liquid on the DUT. Heat transfer from the DUT to the liquid is facilitated by placing a heat sink in contact with the DUT.

U.S. Pat. No. 4,734,872 discloses a system in which a stream of temperature-controlled air is directed at the DUT. The air is drawn into a chiller where its dew point is lowered. The chilled air is then passed to a heater which raises the temperature of the air to a desired level to control the temperature of the DUT. Measurement of the DUT temperature and air stream temperature are used to control the heater and hence the temperature of the air impinging on the DUT.

U.S. Pat. Nos. 4,784,213 and 5,205,132 disclose a variant on the system disclosed in the '872 patent described above. In both of these cases, the air stream is split into a cooled stream and a heated stream. The two streams are then mixed in appropriate proportions to produce a single stream directed at the DUT and having the desired temperature.

U.S. Pat. No. 5,309,090 discloses the heating of a DUT by applying a signal/power to certain structures in the DUT so as to generate heat by their operation and so heat the DUT evenly. This method does not allow the DUT to be cooled in the same way.

Recent developments in high-performance microprocessor design have lead to an increase in power consumption and dissipation from about 10 Watts to 60–70 Watts. Furthermore, the increase in component density within a microprocessor chip and the adoption of modem chip packaging structures has lead to devices which have extremely low thermal inertia, i.e. devices which will heat up and cool down very quickly. CMOS technology used in such chips is characterized by having a power consumption and dissipation which varies depending on the activity of the device. When in normal use, the chips will have cooling devices such as fans mounted nearby or even on the chip package so as to dissipate the heat generated by the operation of these devices. However, during functional testing, these cooling devices are not present and the power dissipated during very high speed functional testing is sufficient to raise the temperature of the device quickly to a level which could permanently damage the device.

The prior art methods of temperature control all rely on a direct measurement of DUT temperature during testing to provide feedback control to the heat exchanger. This approach suffers from a number of problems. It is difficult to make a reliable, consistent temperature measurement at the surface of a device when testing in a high volume manufacturing environment because of the variability in contact resistance encountered. Even with a good temperature measurement, extrapolation of device internal temperature in a high inertia package is problematic. With any feedback system, there is always the problem that the device must change its temperature before the measurement can be made and the thermal response time of the chip can be as low as 30 ms whereas that of the heat exchanger is often in the region 100–200 ms. Therefore, at best, such an arrangement can only smooth temperature variation and can lead to temperature undershoot which is also undesirable.

It is an object of the present invention to provide methods and apparatus which allow temperature control of devices during test, particularly cooling during test.

SUMMARY OF THE INVENTION

One aspect of the present invention provides a method for controlling the temperature of a DUT during a testing operation, comprising: a) measuring a parameter related to power consumption by the DUT during testing; and b) using the parameter related to power consumption to operate a temperature control device to compensate for temperature change due to changes in power consumption by the DUT during testing.

Another aspect of the invention provides an apparatus for controlling the temperature of a DUT during testing, comprising: a) means for measuring a parameter related to power consumption by the DUT during testing; b) a temperature control device which operates to control the temperature of the DUT during test; and c) means for controlling operation of the temperature control device according to the measured parameter related to power consumption.

The power supply (device power supply or "DPS") supplies current to the DUT and measuring this current and, optionally, the voltage allows an almost instantaneous indication of the power consumption of the DUT. Since substantially all of the power consumed by the device appears as heat, and the relatively low thermal inertia of such devices, such a measurement also is indicative of heat dissipation by the device and hence its tendency to change temperature. This approach allows the temperature control signal to be generated well in advance of what would be possible using a direct temperature measurement since the parameter being measured exists before the DUT has even changed its temperature. In high performance IC testers, the current consumption ($I_{DD}$) of the DUT is routinely measured. It is this measurement which can be used to provide the parameter related to power consumption/dissipation of the DUT. The amount of temperature elevation for a given current consumption will depend on a number of factors such as IC package type, form factor, set point temperature etc. In many cases, the effect will be non-linear but can be determined by calibration for a given device type. Where the device has a relatively high thermal inertia, it is desirable to calibrate the performance by including temperature sensors in a test device to allow correlation of $I_{DD}$ with the device internal temperature. The use of $I_{DD}$ measurement is particularly advantageous since this is a parameter which can be accurately and rapidly measured even during high volume testing applications.

The particular form of the temperature control device is a matter of choice. It is necessary that the device can cool the DUT. In order to prevent temperature undershoot, it is also necessary that some form of heating be included to counteract the cooling effect at appropriate times. The choice of temperature control device will affect the manner in which the control signals are used but does not affect the principle of using a power consumption measurement to control operation of the temperature control device. Suitable devices might include the use of mixed heat transfer fluids (hot and cold) to provide the temperature control, or a combination of a cooling fluid and an electric heating element.

While the primary control of temperature is provided by the power consumption measurement, it is also desirable to make actual temperature measurements within the system. The temperature which is critical is that of the DUT and this will depend on the effectiveness of the temperature control device. For example, when the temperature control device includes a heat exchange element which must be placed in contact with the DUT, smoothness of the contacting faces and the contact pressure can affect the effectiveness of heat transfer. Consequently, it may be desirable to include a DUT temperature sensor which can be used to monitor the effectiveness of the temperature control device and provide any offset which may be required to ensure accurate control of the DUT temperature. Measurement of the junction thermal resistance prior to the test in this manner will allow an offset to be determined. Other temperature measurements which might be made are measurements of ambient or set point temperatures of cooling fluids or temperatures of heat exchangers.

When used in a closed-loop control system, measurement of power consumption replaces direct temperature measurement and so provides faster generation of control signals. However, this approach is still reactive and the slower thermal response time of the temperature control device will still allow some variation in DUT temperature when the DUT thermal response time is faster than that of the thermal control device. Another aspect of the present invention is to use an open loop control system. This is possible because the activity of the DUT is known to some degree in advance from the test patterns applied by the test program. Therefore operation of the temperature control device can be synchronized with the test program. During the development of a test program, measurements of $I_{DD}$ are made and from this the power consumption and hence temperature elevation of the DUT can be determined. Another approach is to measure the temperature of the device during each test segment as it is developed and using this measured temperature profile to control the temperature of the device during testing. By determining the temperature profile during a test segment, a temperature control profile can be derived for that segment to keep the DUT at or near the set point and this can be encapsulated in the test program. In this case, the operation of the temperature control device will be under the control of the tester in the same manner as the functional tests applied to the DUT. Using this approach, changes in DUT temperature can be anticipated and control signal applied to the temperature control device to avoid the delay due to the thermal response time, i.e. in advance of the change in heat change actually experienced by the DUT.

While the active control of the temperature control device described above does not rely on measurement of DUT temperature or power consumption during the test, it is still desirable to make such measurements to account for variation in effectiveness of the temperature control from test to test.

BRIEF DESCRIPTION OF THE DRAWINGS

FIG. 3 shows the current consumption (IDD), temperature variation of a DUT and operation of a temperature control device vs. time during a test;

DETAILED DESCRIPTION OF THE INVENTION

In CMOS technology used commonly in VLSI integrated circuits, the current consumption of the IC, and hence the power consumption, varies according to the activity of the device. Typically, about 99% of this power will be present as heat, the exact percentage being dependent on factors such as the particular device, geometry and packaging etc. In normal use, dissipation of this heart is achieved by the use of fans and heat sinks attached to the chip and so the temperature is maintained within well defined bounds. In testing, however, these heat dissipation devices are not present. With power consumption of devices increasing, potentially up to 100W, and the low thermal response time of the packages, typically in the order of 30 ms, the potential for the temperature of the device temperature to rise dramatically during the test is increasing. Devices are often tested at one or more set point temperatures, e.g. 0° C., 25° C., and 100° C. The performance of a device at these temperatures, particularly at higher temperatures will be used to decide on the speed bin to which that part is assigned. Elevation of temperature during testing can itself alter the device in this respect and so alter the yield of devices at a given speed. It is estimated that the effect on yield can be in the order of 0.2%/° C. above set point encountered during test.

Figure 1:
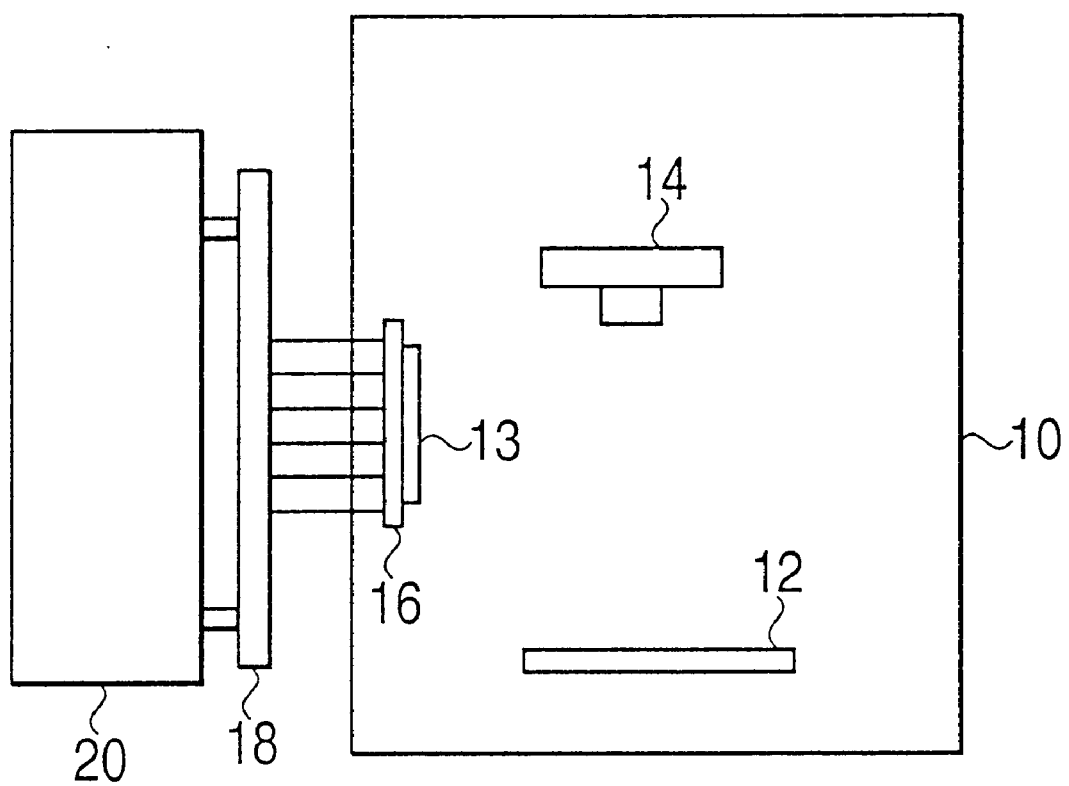
FIG. 1 shows an IC tester incorporating the present invention.

A typical test environment is shown in FIG. 1. An environmental chamber 10 is provided having an internal temperature which is controlled to remain at the desired set point temperature for test (Tsp). A tray or other carrier 12 containing several IC devices to be tested is loaded into the chamber 10. Individual devices 13 are removed from the tray by a pick and place robot 14 and loaded onto a contactor 16 which contacts a load board 18 for interfacing with a test head 20 which forms part of a high-speed tester such as the ITS 9000GX tester available from Schlumberger Technologies, Inc. of San Jose, Calif. The robot 14 includes a temperature control device which will be described in more detail below in relation to FIG. 4, and remains in contact with the DUT 13 until test is complete. The DUT is then returned to the tray 12 and another DUT selected and tested.

Figure 2:
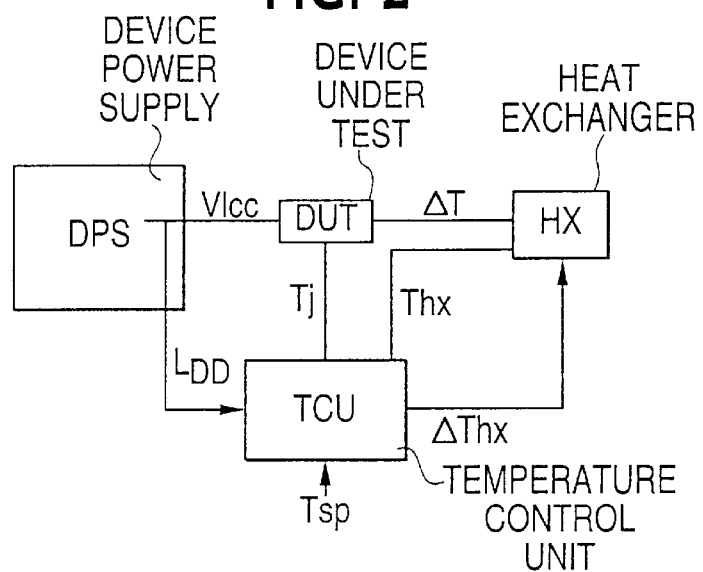
FIG. 2 shows a block diagram of a closed loop temperature control system according to the invention.

FIG. 2 shows a block diagram of a closed loop temperature control system for sue with the arrangement of FIG. 1. The tester 20 includes a device power supply DPS which provides an electrical power supply of predetermined voltage VIDD to the DUT, the drawn current IDD being determined by the activity of the DUT. The DPS includes a sensor with outputs a measurement of IDD during the test. The temperature control device includes a heat exchanger HX which is placed in contact with the DUT, The heat exchanger HX includes a temperature sensor which measures the temperature of the junction Tj between the heat exchanger an the DUT. The temperature Tj is effectively the temperature do the DUT. The heat exchanger also includes a temperature sensor for indicating its own temperature Thx. The temperature measurements Tj and Thx and the current measurement IDD are provided to a temperature control unit TCU together with a set point temperature Tsp which can be derived from a sensor can be input by an operator. TCU outputs a control signal ΔThx to the heat exchanger HX to cause it to change temperature and hence cause the DUT temperature to be affected by an amount ΔT. The measurement of IDD gives an instantaneous measurement of the power consumption by the DUT which in turn can be interpreted as a temperature increase ΔTj which will be seen at the DUT a short time later (the thermal response time), for example 30 ms. As IDD goes high, the temperature of the DUT will tend to rise. Consequently, the TCU outputs a signal ΔThx to the heat exchanger HX to cause it to lower its temperature ΔT and so drawn heat away from the DUT. The magnitude of the change in temperature at the heat exchanger HX will depend on the current heat exchanger temperature Thx, the current DUT temperature Tj an the anticipated temperature elevation ΔTj. When the current consumption drops very low so that there is essentially no elevation of DUT temperature, the heat exchanger temperature Thx is compared wit the set point temperature Tsp and if it is lower, signal ΔThx will cause the heat exchanger HX to increase its temperature to prevent undershoot. The amount by which DUT temperature Tj differs from heat exchanger temperature Thx can be used to indicate the thermal resistance of the junction between the heat exchanger and DUT an so provide an offset to compensate for this.

FIG. 3 shows the variation of $I_{DD}$, Tj and Thx during a typical test in a system as described above. The spikes in Tj are due to the slower response time of the temperature control device compared to that of the DUT. These are much less than would be obtained with a simple temperature measurement feedback closed loop system (shown in dashed line).

Figure 4:
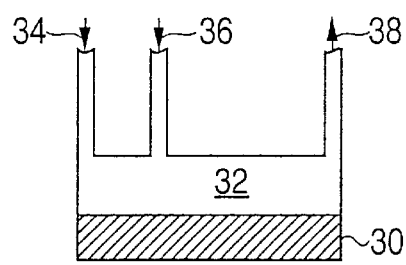
FIG. 4 shows one embodiment of a temperature control device.

One form of temperature control device for use in the present invention is shown in FIG. 4. This comprises a twin loop fluid system having a heat exchange paid 30 in contact with a fluid chamber 32. The pad 30 contacts the DUT when it is picked up by the pick and place robot 14 and remains in contact until replaced in the carrier 12. The fluid chamber 32 has inlets for low temperature fluid 36, and a common outlet 38. The fluid supplies (not shown) are provided with heaters an coolers to drive the temperature of the fluid in that loop to a predetermined level and a system of pumps and valves are used to control mixing of the two fluids to achieve the desired temperature. Systems for mixing temperature-controlled fluids in this manner are known, see form example U.S. Pat. No. 4,784,213. It will be appreciated that the exact implementation of the temperature control device is not important to this invention and other forms of device can be used equally effectively. It is the manner in which the temperature control device is itself controlled in response to DUT power dissipation which is important.

Figure 5:
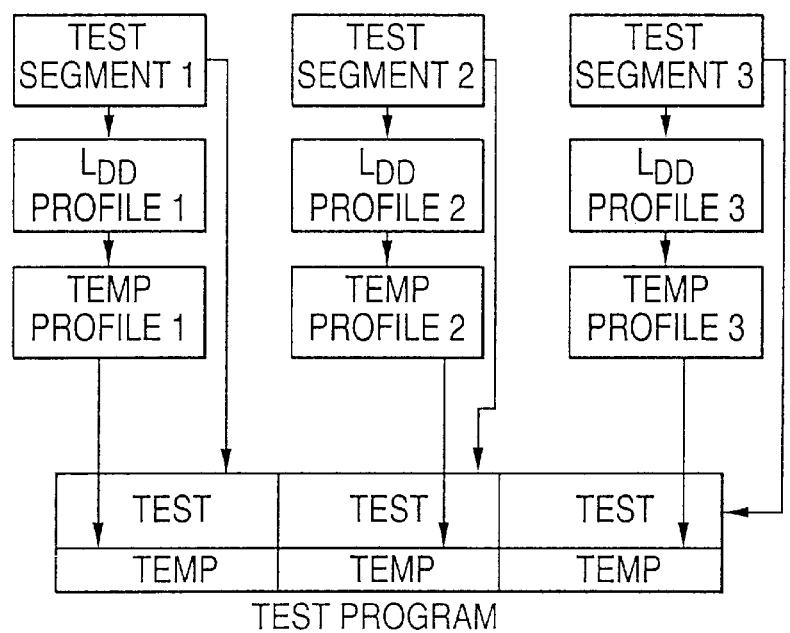
FIG. 5 shows a block diagram of an open loop control system according to the invention.

The systems described above are all closed loop systems and so inevitably have some temperature overshoot or undershoot in operation, see FIG. 3. Another aspect of the present invention seeks to overcome this problem using a open loop approach. FIG. 5 shows a block diagram of an open loop system according to the invention. The test program which will be applied to the DUT during production testing is developed in segments. For each segment, IDD can be determined either by direct measurement of a device during testing or by calculation knowing the power consumption profile can be determined. The profile of temperature control signals required to compensate for the temperature increase due to the current consumption can likewise be determined using essentially the same approach as is used in the closed loop system. The temperature control unit is run under the control of the test program rather than merely in response to measurements made during test. The profile can be time-advanced to compensate for the slower thermal response time of the temperature control device and this reduces the possibility of temperature overshoot or undershoot. Measurements of IDD, Tj and Thx are still made during test in order to determine offsets which might vary from test to test and to confirm correct operation of the system.

Another variation of this approach is to actually measure the device temperature when developing the test segments and then using the measured temperature profile to control operation of the temperature control unit. Such measurements will be affected by the device package type. Consequently, it may be necessary to make measurements for each specific package type. The relationship of the heat exchanger, $I_{DD}$ measurement and temperature measurement is optimized using appropriate software control for each segment

I claim:

1. A method of controlling the temperature of a device, the method comprising:

measuring a parameter other than the temperature of the device, wherein the parameter is related to power consumption by the device, during the creation of a test program for operating the device at at least one set point temperature;

running the test program; and maintaining the temperature of the device close to the at least one set point temperature during the running of the test program based on the parameter related to power consumption.

2. A method according to claim 1, wherein the maintaining includes operating a temperature control device to compensate for temperature changes in the device due to changes in power consumption by the device based on the parameter related to power consumption.

3. A method according to claim 1, wherein the test program comprises a series of stimuli to be applied to the device and a series of control signals for the temperature control device to control device temperature.

4. A method according to claim 3, further comprising: determining current consumption by the device in response to the stimuli; and using the current consumption to create the series of control signals.

5. A method according to claim 3, further comprising creating the test program in a number of segments which are subsequently linked together to create the program applied to the device.

6. A method according to claim 5, further comprising:
determining current consumption by the device for each segment; and
using the current consumption to create the control signals related to that segment.

7. A method according to claim 6, wherein the determination of current consumption for a segment comprises applying the stimuli of the segment to the device and measuring the current consumption resulting therefrom.

8. A method according to claim 1, wherein the temperature control device is operated so as to reduce its temperature when power consumption by the device increases and to return its temperature to the set point temperature when the device power consumption drops.

9. A method according to claim 1, further comprising generating a control signal indicative of a change in temperature for the temperature control device to control the temperature of the device during testing.

10. An apparatus for controlling the temperature of a device, comprising:
a sensor which measures a parameter other than the temperature of the device, wherein the parameter is related to power consumption by the device, during the creation of a test program for operating the device at at least one set point temperature;
a tester which runs the test program; and
a temperature control device which maintains the temperature of the device close to the at least one set point temperature during the running of the test program based on the parameter related to power consumption.

11. An apparatus according to claim 10, wherein the temperature control device compensates for temperature changes in the device due to changes in power consumption by the device based on the parameter related to power consumption.

12. An apparatus according to claim 10, wherein the test program comprises a series of stimuli to be applied to the device and a series of control signals for the temperature control device to control device temperature.

13. An apparatus according to claim 12, further comprising a current sensor which determines current consumption by the device in response to the stimuli, wherein the current consumption is used to create the series of control signals.

14. An apparatus according to claim 12, wherein the test program includes a number of segments which are subsequently linked together to create the program applied to the device by the tester.

15. An apparatus according to claim 14, wherein the current sensor determines current consumption by the device for each segment.

16. An apparatus according to claim 10, wherein the temperature control device is operated so as to reduce its temperature when power consumption by the device increases and to return its temperature to the set point temperature when the device power consumption drops.

17. An apparatus according to claim 1, wherein the test program includes a control signal indicative of a change in temperature for the temperature control device to control the temperature of the device during testing.

18. A system for controlling the temperature of a device, comprising:
means for measuring a parameter other than the temperature of the device, wherein the parameter is related to power consumption by the device, during the creation of a test program for operating the device at at least one set point temperature;
means for running the test program; and
means for maintaining the temperature of the device close to the at least one set point temperature during the running of the test program based on the parameter related to power consumption.

19. A system according to claim 18, wherein the means for maintaining includes means for operating a temperature control device to compensate for temperature changes in the device due to changes in power consumption by the device based on the parameter related to power consumption.

20. A system according to claim 18, wherein the test program comprises a series of stimuli to be applied to the device and a series of control signals for the temperature control device to control device temperature.

21. A system according to claim 20, further comprising:
means for determining current consumption by the device in response to the stimuli; and
means for using the current consumption to create the series of control signals.

22. A system according to claim 20, further comprising means for creating the test program in a number of segments which are subsequently linked together to create the program applied to the device.

23. A system according to claim 22, further comprising:
means for determining current consumption by the device for each segment; and
means for using the current consumption to create the control signals related to that segment.

24. A system according to claim 23, wherein the means for determining the current consumption for a segment comprises means for applying the stimuli of the segment to the device and measuring the current consumption resulting therefrom.

25. A system according to claim 18, wherein the temperature control device is operated so as to reduce its temperature when power consumption by the device increases and to return its temperature to the set point temperature when the device power consumption drops.

26. A system according to claim 18, further comprising means for generating a control signal indicative of a change in temperature for the temperature control device to control the temperature of the device during testing.

* * * * *